US009257517B2

(12) United States Patent
Braithwaite et al.

(10) Patent No.: US 9,257,517 B2
(45) Date of Patent: Feb. 9, 2016

(54) VERTICAL DMOS-FIELD EFFECT TRANSISTOR (75) Inventors: Rohan S. Braithwaite, Gilbert, AZ (US); Randy L. Yach, Phoenix, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 994 days.

(21) Appl. No.: 13/291,344

(22) Filed: Nov. 8, 2011

(65) Prior Publication Data
US 2012/0126314 A1 May 24, 2012

Related U.S. Application Data (60) Provisional application No. 61/416,638, filed on Nov. 23, 2010.

(51) Int. Cl.
*H01L 29/423* (2006.01)
*H01L 29/66* (2006.01)
*H01L 29/78* (2006.01)
(Continued)

(52) U.S. Cl.
CPC .... *H01L 29/42368* (2013.01); *H01L 29/42376* (2013.01); *H01L 29/66712* (2013.01); *H01L 29/7802* (2013.01); *H01L 29/04* (2013.01);
(Continued)

(58) Field of Classification Search
CPC ............... H01L 29/7802; H01L 29/42368; H01L 29/42376; H01L 29/66712
USPC ........................................................ 257/329
See application file for complete search history.

(56) References Cited

U.S. PATENT DOCUMENTS 5,023,196 A * 6/1991 Johnsen et al. ............... 438/270
6,870,221 B2 * 3/2005 Venkatraman ................ 257/341
(Continued)

FOREIGN PATENT DOCUMENTS

EP 1313147 A2 5/2003 ............. H01L 29/08
JP 59130473 7/1984 ............. H01L 29/78
(Continued)

OTHER PUBLICATIONS

Goodenough, F., "Microcontroller Switches 5-A, 60-V Current Pulses", Electronic Design, vol. 14, No. 21, pp. 71-72, 76-77, 79, Oct. 14, 1993.
(Continued)

*Primary Examiner* — Laura Menz
*Assistant Examiner* — Candice Y Chan
(74) *Attorney, Agent, or Firm* — Slayden Grubert Beard PLLC (57) ABSTRACT A vertical diffused metal oxide semiconductor (DMOS) field-effect transistors (FET) comprises a substrate of a first conductivity type forming a drain region; an epitaxial layer of the first conductivity type on said substrate; first and second base regions of the second conductivity type within said epitaxial layer, spaced apart by a predefined distance; first and second source regions of a first conductivity type arranged in said first and second base regions, respectively, wherein said first and second base region is operable to form first and second lateral channels between said source region and said epitaxial layer; a gate structure insulated from said epitaxial layer by an insulation layer and arranged above the region between the first and second base regions and wherein the gate structure comprises first and second gate regions, each gate region only covering the first and second channel, respectively within said first and second base region.

13 Claims, 7 Drawing Sheets (51) Int. Cl.
*H01L 29/04* (2006.01)
*H01L 29/08* (2006.01)
*H01L 29/10* (2006.01)

(52) U.S. Cl.
CPC ......... *H01L29/0878* (2013.01); *H01L 29/1045* (2013.01); *H01L 29/1095* (2013.01)

(56) References Cited

U.S. PATENT DOCUMENTS

2007/0072352 A1   3/2007   Kushiyama et al. .......... 438/186
2012/0126312 A1*  5/2012   Dix et al. ...................... 257/329

FOREIGN PATENT DOCUMENTS

JP    02216871    8/1990   ............ H01L 29/784
JP    06268208    9/1994   .............. H01L 29/74

OTHER PUBLICATIONS

Taylor, B. et al., "The IR8200 Monolithic DMOS H-Bridge Power Control IC", Electronic Engineering, vol. 61, No. 745, ; pp. 43-48, Jan. 1989.
International PCT Search Report, PCT/US2011/061590, 15 pages, Jun. 6, 2012.
International Preliminary Report on Patentability, Application No. PCT/US2011/061590, 9 pages, May 28, 2013.

* cited by examiner

VERTICAL DMOS-FIELD EFFECT TRANSISTOR

CROSS-REFERENCE TO RELATED APPLICATIONS

This application claims the benefit of U.S. Provisional Application No. 61/416,638 filed on Nov. 23, 2010, entitled "LOW CAPACITANCE VERTICAL GATE-FIELD EFFECT TRANSISTOR", which is incorporated herein in its entirety

TECHNICAL FIELD

This application concerns a vertical DMOS-Field Effect Transistor (FET).

BACKGROUND

Figure 6:
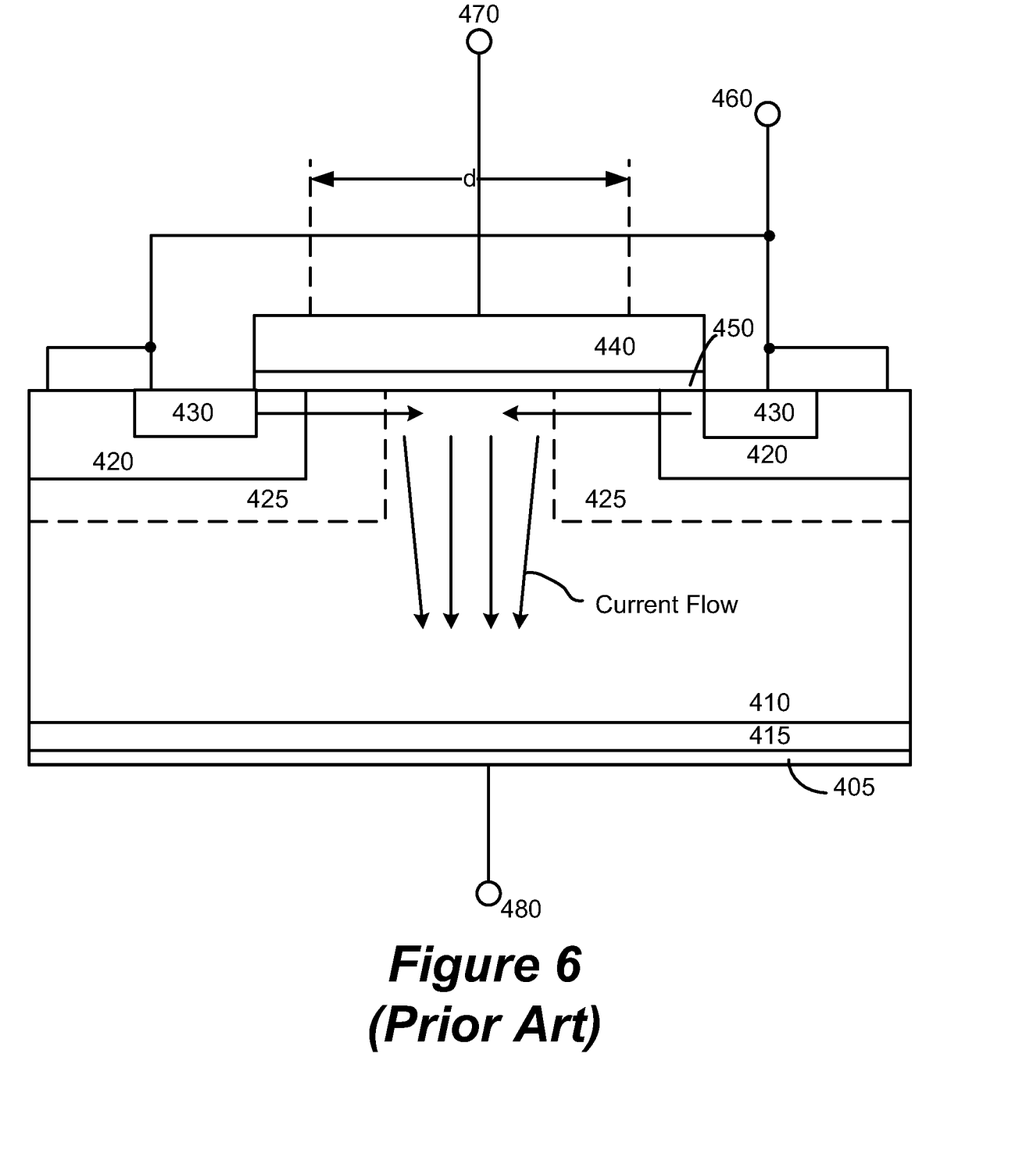
FIG. 6 shows a conventional vertical DMOS-FET.

Power metal oxide semiconductor field-effect transistors (MOSFET) are generally used to handle high power levels in comparison to lateral transistors in integrated circuits. FIG. 6 shows a typical MOSFET which uses a vertical diffused MOSFET structure, also called double-diffused MOSFET structure (DMOS or VDMOS).

As shown, for example, in FIG. 6, on an N+ substrate 415 there is a N− epitaxial layer formed whose thickness and doping generally determines the voltage rating of the device. From the top into the epitaxial layer 410 there are formed N+ doped left and right source regions 430 surrounded by P-doped region 420 which forms the P-base. The P-base may have an out diffusion area 425 surrounding the P-base 420. A source contact 460 generally contacts both regions 430 and 420 on the surface of the die and is generally formed by a metal layer that connects both left and right source region. An insulating layer 450, typically silicon dioxide or any other suitable material, insulates a polysilicon gate 440 which covers a part of the P-base region 420 and out diffusion area 425. The gate 440 is connected to a gate contact 470 which is usually formed by another metal layer. The bottom side of this vertical transistor has another metal layer 405 forming the drain contact 480. In summary, FIG. 6 shows a typical elementary cell of a MOSFET that can be very small and comprises a common drain, a common gate and two source regions and two channels. Other similar cells may be used in a vertical power MOSFET. A plurality of such cells may generally be connected in parallel to form a power MOSFET.

In the On-state, a channel is formed within the area of regions 420 and 425 covered by the gate reaching from the surface into the regions 420 and 425, respectively. Thus, current can flow as indicated by the horizontal arrow. The cell structure must provide for a sufficient width d of gate 440 to allow for this current to turn into a vertical current flowing to the drain side as indicated by the vertical arrows.

Such structures have a relatively high gate source capacitance due to the necessary width of the gate which is undesirable, in particular, in high frequency switching applications such as switched mode power supplies.

SUMMARY

According to an embodiment, a vertical diffused metal oxide semiconductor (DMOS) field-effect transistors (FET), with a cell structure may comprise a substrate of a first conductivity type forming a drain region; an epitaxial layer of the first conductivity type on said substrate; first and second base regions of the second conductivity type within said epitaxial layer, spaced apart by a predefined distance; first and second source regions of a first conductivity type arranged in said first and second base regions, respectively, wherein said first and second base region is operable to form first and second lateral channels between said source region and said epitaxial layer; a gate structure insulated from said epitaxial layer by an insulation layer and arranged above the region between the first and second base regions and wherein the gate structure comprises first and second gate regions, each gate region only covering the first and second channel, respectively within said first and second base region.

According to a further embodiment, the insulating layer may comprise a gate oxide layer on top of which a thick oxide layer is deposited and patterned. According to a further embodiment, the thick oxide layer can be patterned to form a pedestal between said first and second source regions. According to a further embodiment, the vertical DMOS-FET may further comprise a lightly doped area of the second conductivity type extending from the surface into the epitaxial layer between the first and second base regions. According to a further embodiment, the vertical DMOS-FET may further comprise a sinker extending from the surface into the epitaxial layer between the first and second base regions. According to a further embodiment, the vertical DMOS-FET may further comprise a source metal layer connecting said first and second source region and said first and second base region. According to a further embodiment, the vertical DMOS-FET may further comprise first and second diffusion areas of said second conductivity type surrounding said first and second base regions, respectively. According to a further embodiment, the gate structure may comprise a bridging section connecting the first and second gate and being farther spaced apart from said epitaxial layer than said first and second gate. According to a further embodiment, the bridging area can be arranged outside the cell structure. According to a further embodiment, the first and second gate can be connected by wire bonding. According to a further embodiment, the vertical DMOS-FET may further comprise a drain metal layer on the backside of the substrate. According to a further embodiment, the cell structure or a plurality of cell structures can be formed in an integrated circuit device. According to a further embodiment, the integrated circuit device may provide for control functions for a switched mode power supply. According to a further embodiment, the first conductivity type can be P-type and the second conductivity type is N-type. According to a further embodiment, the first conductivity type can be N-type and the second conductivity type is P-type.

According to another embodiment, a method for manufacturing a cell structure of a vertical diffused metal oxide semiconductor (DMOS) field-effect transistors (FET), may comprise: forming a cell structure comprising first and second source regions of a first conductivity type within a first and second base region of a second conductivity type in an epitaxial layer of a first conductivity type arranged on a substrate of a first conductivity type, wherein the first and second base regions are spaced apart by a predefined distance, and wherein said first and second base region is operable to form first and second lateral channels between said source region and said epitaxial layer; forming a gate insulating layer on top of said epitaxial layer having a pedestal between said first and second base region; forming first and second gates on side walls of said pedestal covering said first and second channel.

According to a further embodiment of the method, the step of forming a gate insulating layer may comprise: depositing a thin gate oxide layer, depositing a thick oxide layer on top the thin gate oxide layer, and etching the thick oxide layer to form said pedestal. According to a further embodiment of the method, the method may further comprise forming a lightly doped region extending from the surface of the epitaxial layer into the epitaxial layer between said first and second base region. According to a further embodiment of the method, the step of forming the first and second gate may provide for a bridging area of a gate structure connecting the first and second gates. According to a further embodiment of the method, the bridging area can be located outside the cell structure. According to a further embodiment of the method, the method may further comprise connecting the first and second gates by a metal layer. According to a further embodiment of the method, the method may further comprise connecting the first and second gates by wire bonding. According to a further embodiment of the method, the method may further comprise forming a sinker structure in the center area between said first and second base regions extending from the surface of the expitaxial layer to the substrate.

DETAILED DESCRIPTION

Figure 1:
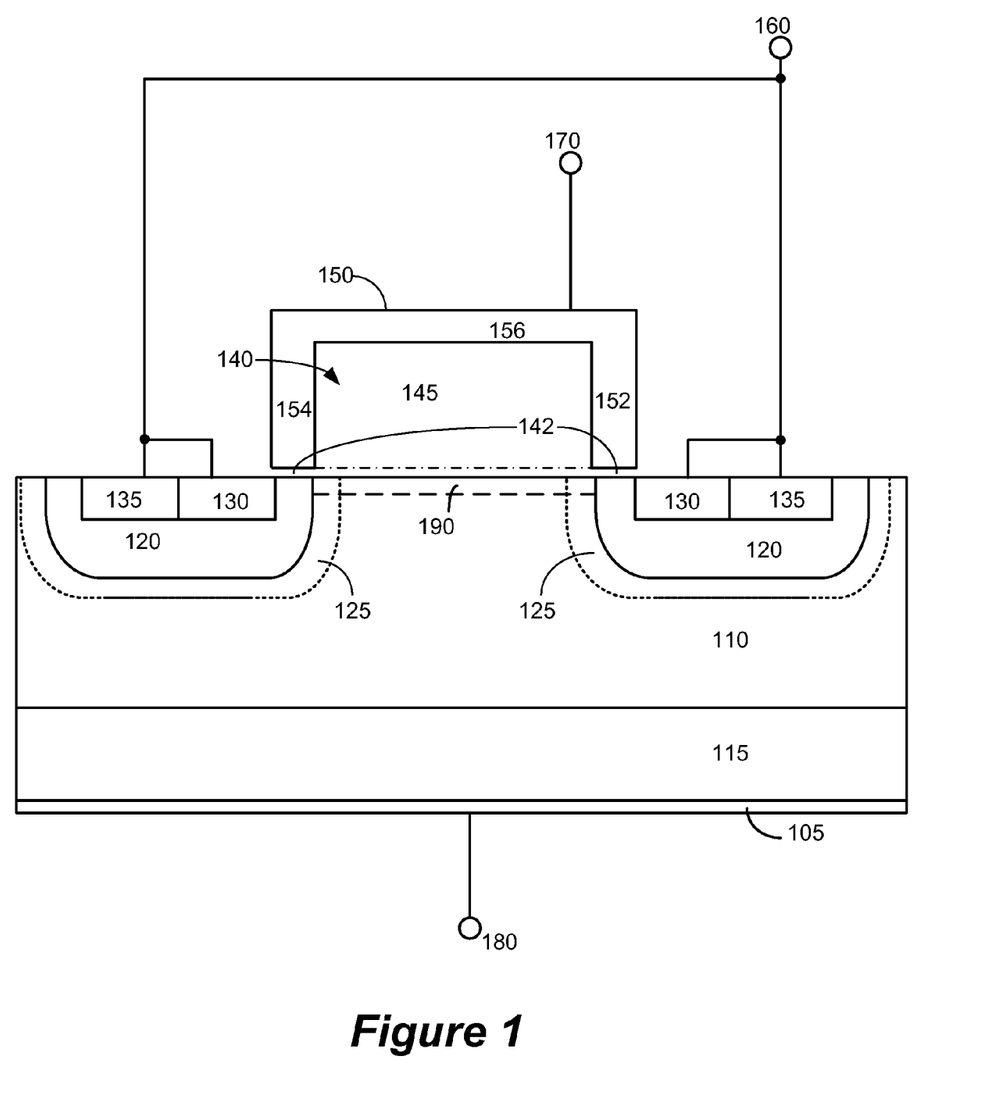
FIG. 1 shows a first embodiment of an improved vertical DMOS-FET.

FIG. 1 shows a cross-sectional view of a vertical DMOS-FET according to various embodiments. A highly doped N+ substrate 115 is provided on top of which an N− epitaxial layer 110 has been grown. From the top into the epitaxial layer 110 there are formed N+ doped left and right source regions 130 each surrounded by a P-doped region 120 which forms the P-base. A heavier doped P+ region 135 can be implanted within the P-base 120 for connection to the source terminal. Each P-base 120 may additionally be surrounded by an associated out diffusion area 125 as indicated by the dotted line. Other structures for the left and right source regions 130 may be used. Similar as for the transistor shown in FIG. 6, a source contact 160 generally contacts both regions 130 and 120 on the surface of the die and is generally formed by a metal layer that connects both left and right source region. An insulating structure 140 is used to insulate a left and right gates 152, 154. According to an embodiment, this structure 140 comprises a gate oxide layer 142 under polysilicon gate 152, 154 of the transistor as indicated by the dash-dotted line. This gate oxide layer 142 can be formed using a deposited oxide which is followed up by a thermal oxidation which densifies the deposited oxide 142 making it more robust.

Contrary to the conventional vertical DMOS-FET, the insulating structure 140 comprises a further thick insulating layer 145 which is deposited and masked on this gate oxide layer 140 which covers the central space between the right and left P-bases 120. According to an embodiment, this thick oxide 145 is deposited before the contacts to source 130/135 are cut. This further insulating layer 145 can be the inter-metal dielectric (IMD) which also helps to separate the metal contacts from the Gate electrode. Here, the thick insulating layer 145 is masked and etched to form a left and right step on layer 142 and therefore a pedestal area in the center as will be explained in more detail below. The right and left gate 152, 154 is then formed by polysilicon on the right and left thin portions of the insulating layer 142 along the side walls of the pedestal section 145 of insulating structure 140. Right and left gates 152 and 154 each cover a part of the respective left and right P-base region 120. Hence, left and right channels can be formed within the P-base regions 120 with appropriate voltages applied to the gate and source contacts. The gates 152 and 154 are interconnected by a bridging area 156 on top of the pedestal 145. The pedestal 145 is thick enough to avoid a significant contribution of the bridging area to the gate capacitance. Thus, according to various embodiments, the cell proposed structure does not only create two source regions 120, 130, 135 and two channels but also two polysilicon gates 152 and 154. According to further embodiments, a lightly doped area 190 may be provided in the center section between the left and right P-base regions which extends from the top surface into the epitaxial layer 110 as shown by the broken line in FIG. 1. The bottom side of this vertical transistor has again another metal layer 105 forming the drain contact 180.

The small footprint of the narrow gates 152, 154 provides for very small gate capacitances. Hence, the resulting individual gate-source and gate-drain capacitances are effectively in sum much smaller than the respective gate capacitances of a conventional vertical DMOS-FET as for example shown in FIG. 6. The various embodiments, thus, effectively provide for two trench gates 152, 154 wherein the bridging area 156 is spaced apart from the epitaxial layer 110 to only contribute insignificantly with respect to the gate capacitances. As will be explained below in more detail, the bridging area 156 may also be omitted entirely or arranged outside the cell area.

Figure 2:
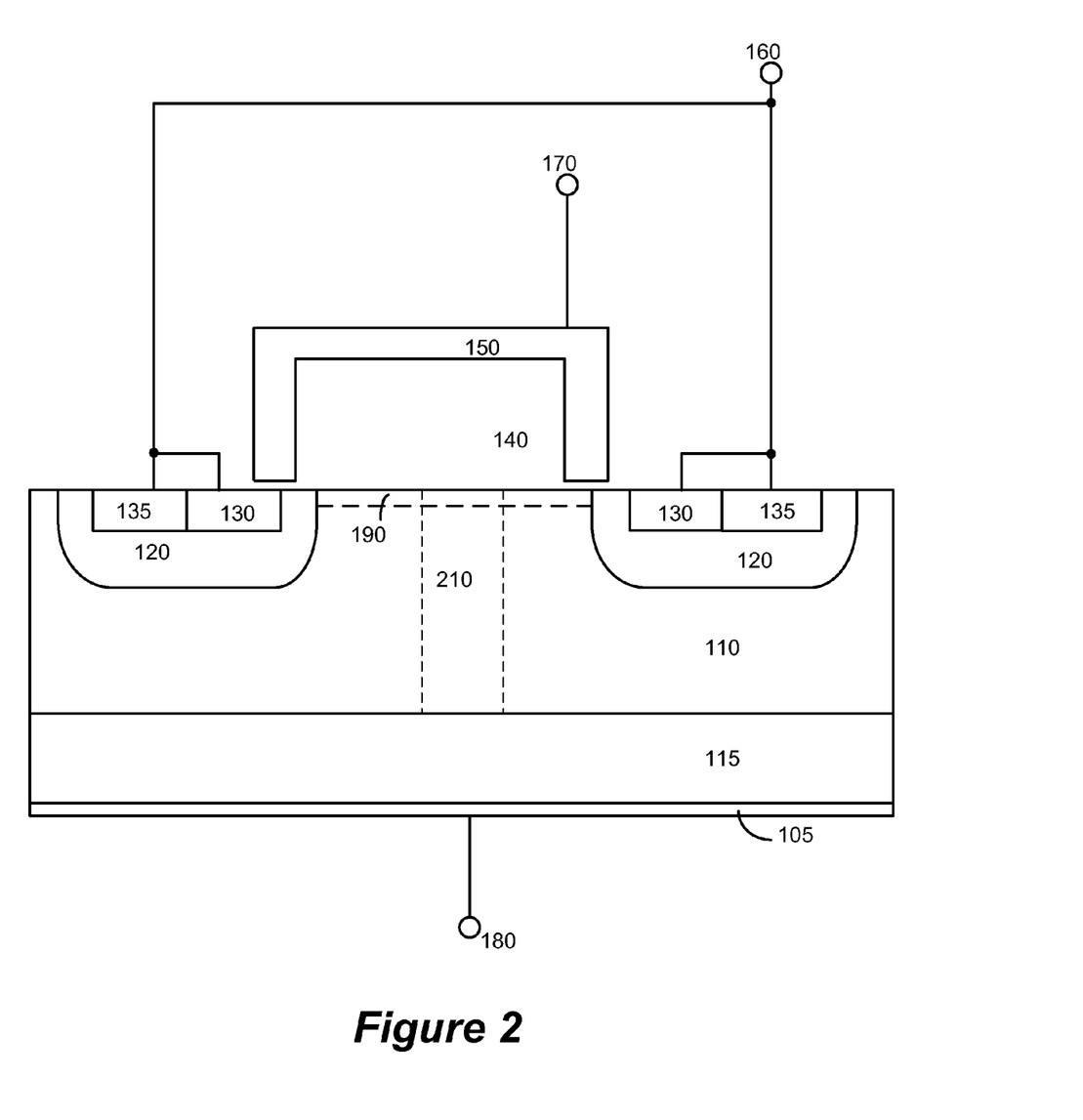
FIG. 2 shows a second embodiment of an improved vertical DMOS-FET.

FIG. 2 shows another embodiment. The general structure of the power transistor cell can be identical to the embodiment shown in FIG. 1. In addition a sinker structure 210, for example a polysilicon sinker, can be formed in the center of the region between the left and right P-base regions 120 extending from the top surface of the epitaxial layer 110 to the substrate 115. The sinker implant 210 is used to provide a low resistance path for the current to flow when the device is in full operation. It also helps in reducing the Rdson for the device since it will effectively reduce the resistance of the N− epitaxial film 110 locally.

Figure 3:
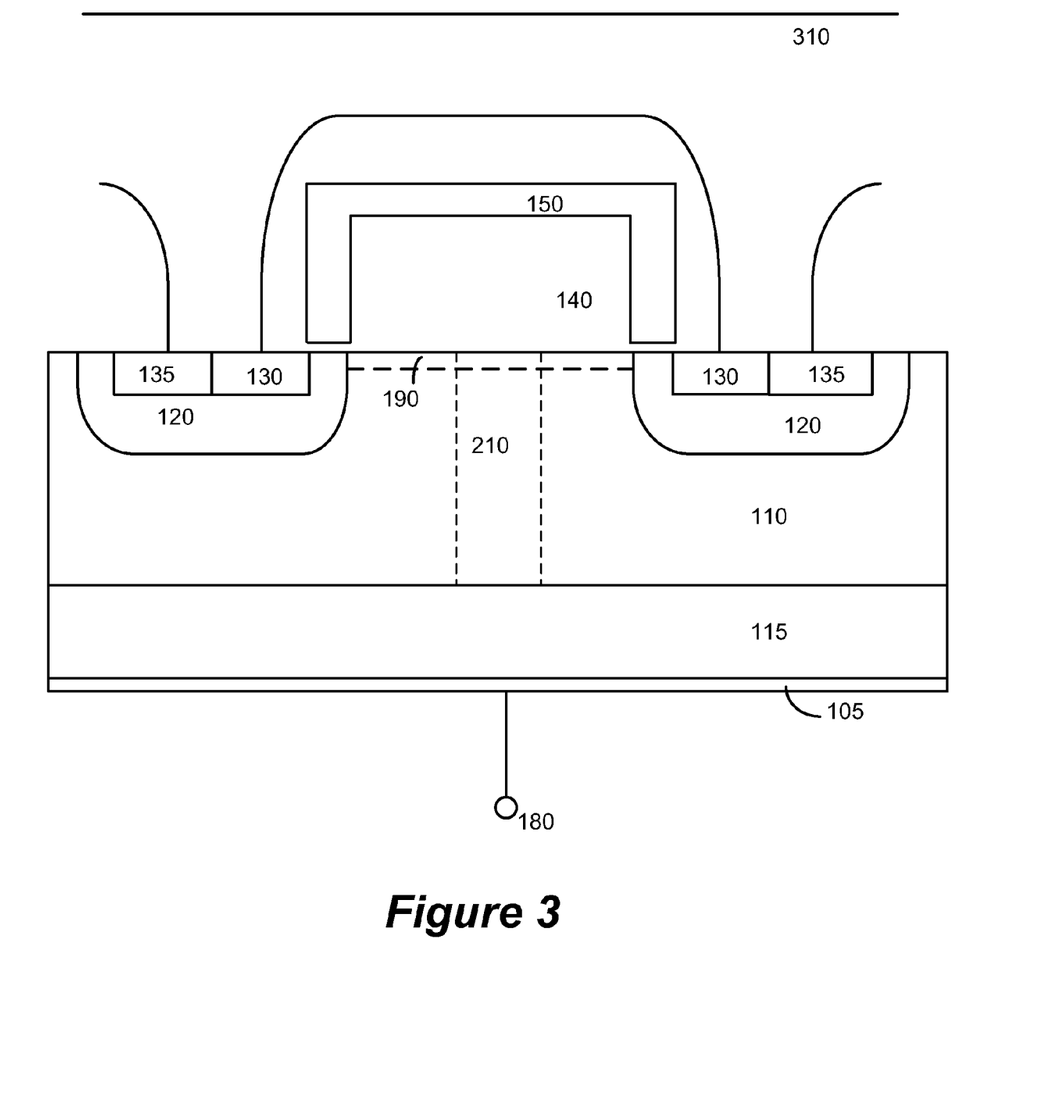
FIG. 3 shows a third embodiment of an improved vertical DMOS-FET.

FIG. 3 shows the cell of FIG. 2 after a metal layer 310 has been formed. Metal layer 310 provides for an electrical connection of the source region 130 and neighboring contact zone 140 effectively connecting the P-base 120 and the source. The metal layer 310 also connects left and right source regions 130, 140 as well as source regions of further cells.

Figure 4A:
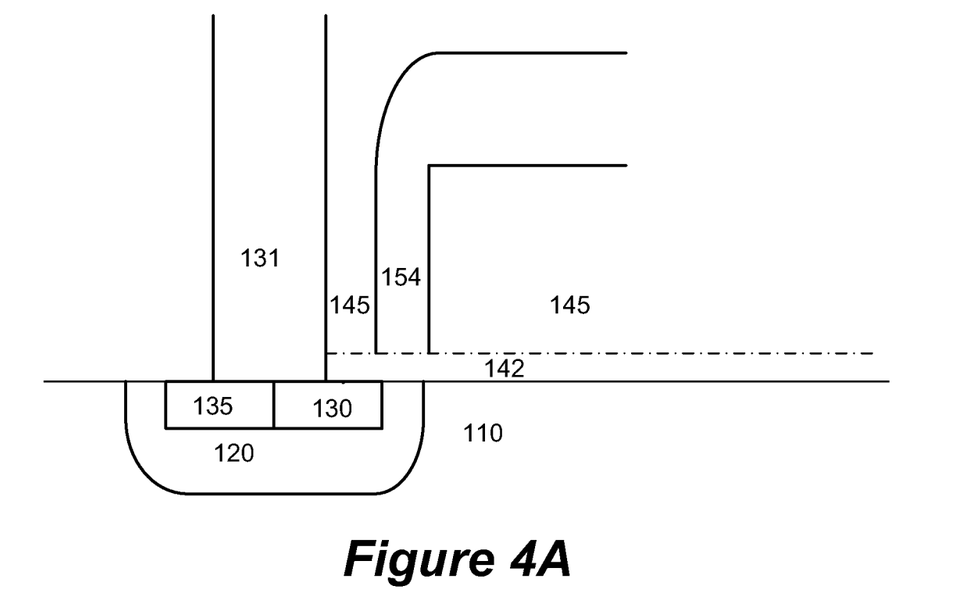
FIG. 4A, 4B show an more detailed view of a gate according to various embodiments.
Figure 4B:
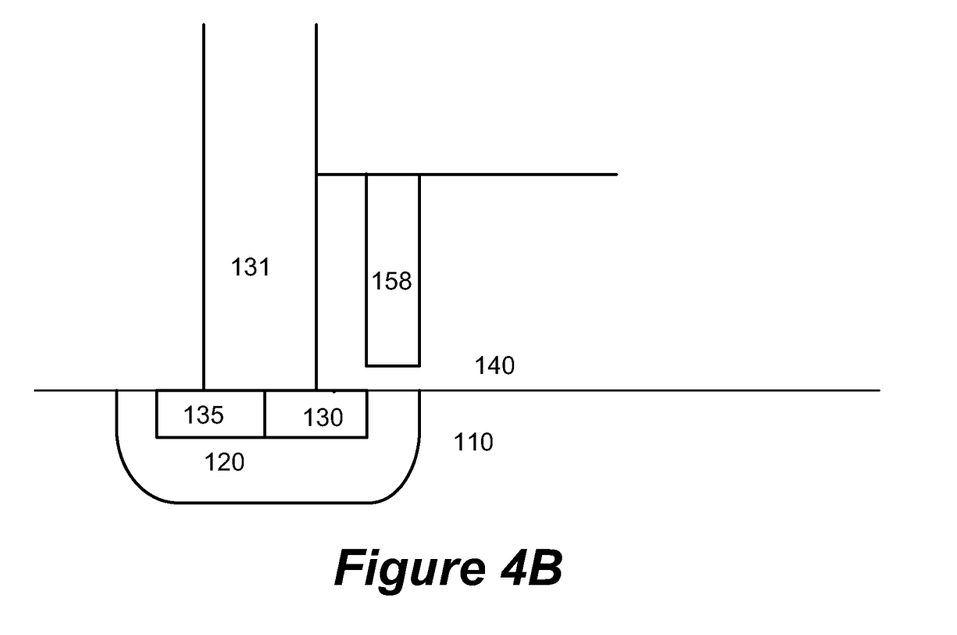

FIG. 4A shows a the narrow trench gate 154 which is surrounded by the thick insulating layer 145 and sits on top of gate oxide layer 142. According to another embodiment as shown in FIG. 4B, a single gate oxide layer 140 is deposited and trench 158 is formed within this layer 140.

Figure 5A:
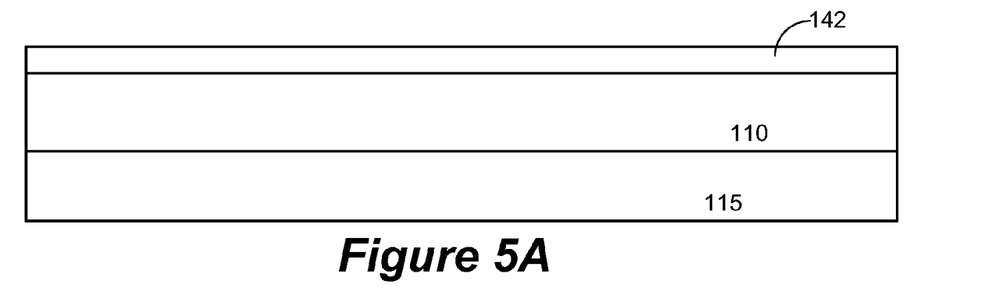
FIG. 5A-5E shows several exemplary process steps for manufacturing a device according to various embodiments.
Figure 5B:
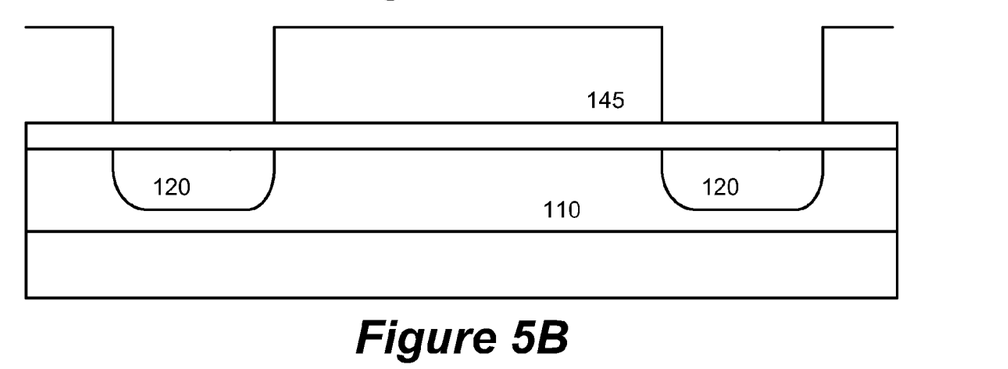
Figure 5C:
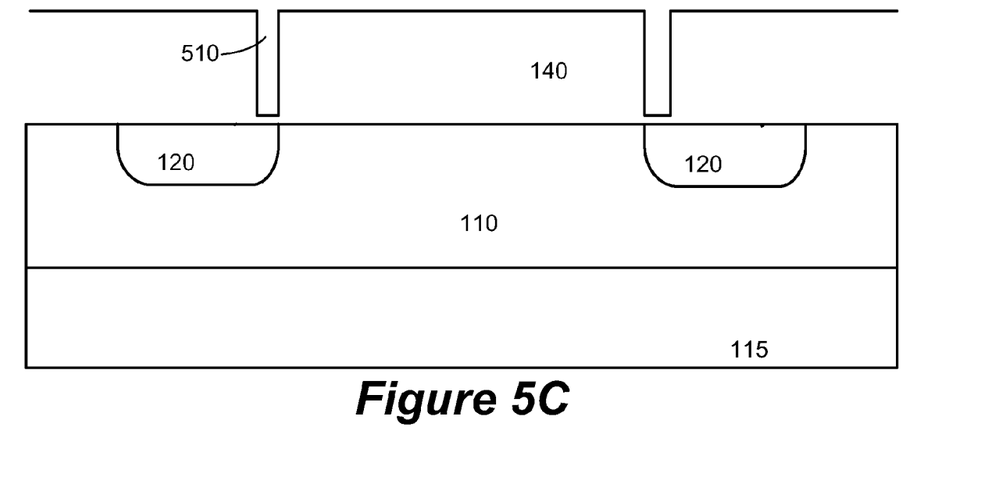
Figure 5D:
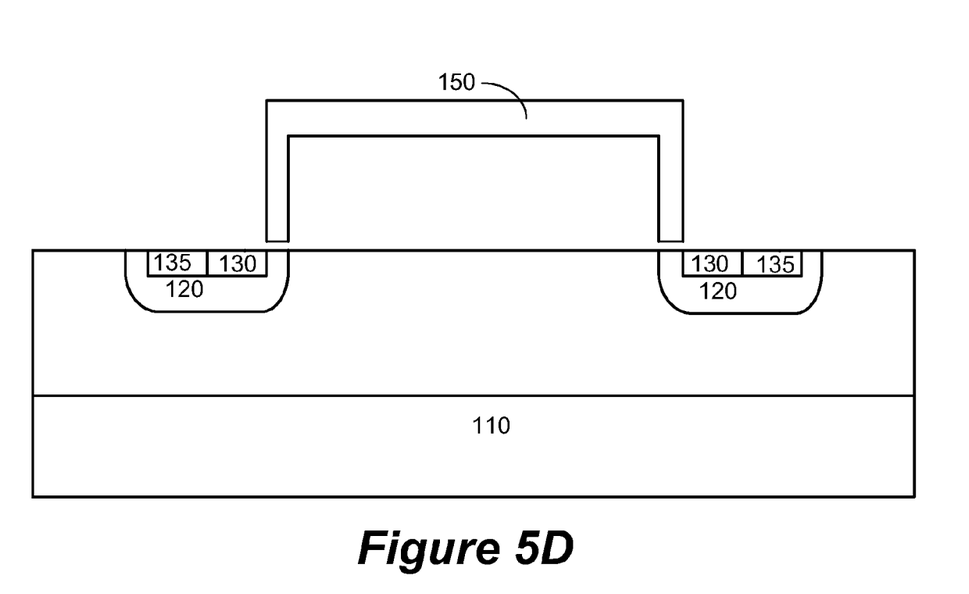
Figure 5E:
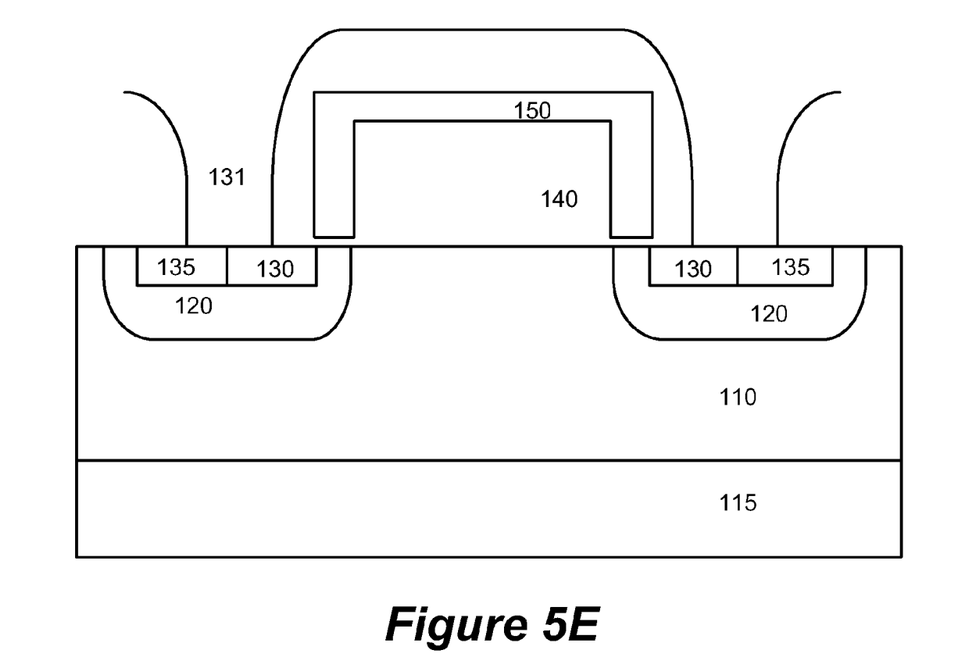

FIG. 5A-5E show exemplary process steps for manufacturing a device as shown in FIG. 1. However, according to the applied technology other steps may be suitable to produce a similar device. As shown in FIG. 5A, an N− doped epitaxial layer 110 is grown on a heavily doped N+ substrate 115. On top of the epitaxial layer 110 an oxide layer 142, such as silicondioxide or any other appropriate gate oxide layer is deposited. This gate oxide layer 142 can be formed using a deposited oxide which is followed up by a thermal oxidation which densifies the deposited oxide making it more robust. As shown in FIG. 5B, a thick insulating oxide layer 145 such as an inter-metal dielectric layer is then deposited on the gate oxide 142. The thick insulating layer 145 can be patterned as shown in FIGS. 5B and P-doped base regions 120 can be formed in the epitaxial layer 110 with well known diffusion techniques. The P-base regions are then covered again with thick oxide layer 145 and narrow trenches 510 are formed within the thick oxide layer 145 as shown in FIG. 5C. A polysilicon layer can then be deposited on top of the layer and can be patterned by appropriate masking and etching techniques to form the gate structure having a reversed U-shape as shown in FIG. 5D. This gate structure 150 can then be used as a mask to cut out the metal connection vias for metal layer 131 connecting the left and right source regions 130, 135. Thus, the cell structure can be self aligned. Furthermore, FIG. 5E shows the cell after metal layer 131 contacting the sources and back metal layer 105 contacting the drain region 115 have been deposited.

According to an embodiment, the step of patterning the gate insulating structure 140 to form gate structure 150 may also be performed in one single step. Thus, no additional process step is required. However, according to other embodiments, more than one step may be used for example when providing for the trench gate structure shown in FIG. 4A or if the bridging are 156 is partially removed to connect the gates 152 and 154 outside the cell structure area.

The cell structure can be a stripe structure as shown in FIG. 1-3. However, according to other embodiments may use square cells, hexagonal shapes or any other suitable cell shape for which the principle of the various embodiments can be applied to. The cell structure or a plurality of cells can be used to form a power DMOS-FET within an integrated circuit or in a discrete transistor device. Such an integrated circuit may provide control circuits for use in a switched mode power supply. Thus, no external power transistors may be necessary.

Furthermore, the exemplary embodiment shows a P-channel device with appropriate conductivity type of the different regions. A person skilled in the art will appreciate that the embodiments of the present application are not restricted to P-channel devices but can be also applied to N-Channel devices

What is claimed is:

1. A vertical diffused metal oxide semiconductor (DMOS) field-effect transistors (FET), with a cell structure comprising:
   a substrate of a first conductivity type forming a drain region;
   an epitaxial layer of the first conductivity type on said substrate;
   first and second base regions of a second conductivity type within said epitaxial layer, spaced apart by a predefined distance;
   first and second source regions of a first conductivity type arranged in said first and second base regions, respectively, wherein said first and second base region are operable to form first and second lateral channels between said source region and said epitaxial layer;
   a gate structure insulated from said epitaxial layer by an insulating layer and arranged above the region between the first and second base regions and wherein the gate structure comprises first and second gate regions each forming a first and second gate, each gate region only covering the first and second lateral channel, respectively within said first and second base region, wherein the insulating layer comprises a gate oxide layer on top of which a thick oxide layer is arranged and patterned to form a pedestal between said first and second source regions and wherein the gate structure is U-shaped and surrounding said pedestal,
   wherein the first and second gate are formed only by first and second vertical side walls of said U-shaped gate structure and wherein the first and second vertical side walls have a thickness defined by a trench and horizontal bottom end faces having said thickness of said trench form the first and second gate, respectively and cover the first and second lateral channels, respectively.

2. The vertical DMOS-FET according to claim 1, further comprising a lightly doped area of the second conductivity type extending from a surface into the epitaxial layer between the first and second base regions.

3. The vertical DMOS-FET according to claim 1, further comprising a sinker extending from a surface into the epitaxial layer between the first and second base regions.

4. The vertical DMOS-FET according to claim 1, further comprising a source metal layer connecting said first and second source region and said first and second base region.

5. The vertical DMOS-FET according to claim 1, further comprising first and second diffusion areas of said second conductivity type surrounding said first and second base regions, respectively.

6. The vertical DMOS-FET according to claim 1, wherein the U-shaped gate structure comprises a bridging section connecting the first and second gate regions and being farther spaced apart from said epitaxial layer than said first and second gate.

7. The vertical DMOS-FET according to claim 6, wherein the bridging section is arranged outside the cell structure.

8. The vertical DMOS-FET according to claim 1, further comprising a drain metal layer on the backside of the substrate.

9. The vertical DMOS-FET according to claim 1, wherein the cell structure or a plurality of cell structures are formed in an integrated circuit device.

10. The vertical DMOS-FET according to claim 9, wherein the integrated circuit device provides for control functions for a switched mode power supply.

11. The vertical DMOS-FET according to claim 1, wherein the first conductivity type is P-type and the second conductivity type is N-type.

12. The vertical DMOS-FET according to claim 1, wherein the first conductivity type is N-type and the second conductivity type is P-type.

13. The vertical DMOS-FET according to claim 1, further comprising a first and second contact region of the second conductivity type being doped heavier than the first and second base regions and being arranged within the first and second base region, respectively for providing a contact with the source metal layer.

* * * * *